United States Patent [19]
Liu et al.

[11] Patent Number: 5,981,994
[45] Date of Patent: *Nov. 9, 1999

[54] METHOD AND SEMICONDUCTOR CIRCUIT FOR MAINTAINING INTEGRITY OF FIELD THRESHOLD VOLTAGE REQUIREMENTS

[75] Inventors: David K. Y. Liu, Cupertino; Jian Chen, San Jose; Ming Sang Kwan, San Leandro, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,142

[22] Filed: Oct. 30, 1995

[51] Int. Cl.⁶ .......................... H01L 29/788; H01L 29/76; H01L 29/792; H01L 29/94
[52] U.S. Cl. .......................... 257/315; 257/314; 257/316; 257/326; 257/396; 257/508
[58] Field of Search ...................................... 257/315, 316, 257/326, 314, 409, 508, 395, 396, 397; 365/185.01, 185.26

Primary Examiner—Steven H. Loke
Attorney, Agent, or Firm—Sawyer & Associates

[57] ABSTRACT

A method for maintaining a high field threshold voltage in a plurality of transistors of reduced size in a periphery region of a Flash EPROM semiconductor circuit includes forming a first polysilicon layer as a floating poly in a predetermined number of transistors of the plurality of transistors in the periphery region, and forming a second polysilicon layer as a common gate line in the plurality of transistors, wherein the predetermined number of transistors prevent breakdown of the plurality of transistors below a predetermined field threshold voltage. In one aspect, the field oxide layer has a thickness of about 2500 angstroms. A plurality of transistors formed in a substrate of a periphery region of a Flash EPROM semiconductor circuit includes a first predetermined number of periphery transistors having a floating poly and a common gate line, and a second predetermined number of periphery transistors having the common gate line and adjacent the first predetermined number of transistors, the first predetermined number of transistors preventing breakdown of the second predetermined number of periphery transistors below a predetermined field threshold voltage.

15 Claims, 4 Drawing Sheets

METHOD AND SEMICONDUCTOR CIRCUIT FOR MAINTAINING INTEGRITY OF FIELD THRESHOLD VOLTAGE REQUIREMENTS

FIELD OF THE INVENTION

The present invention relates to periphery transistor cell structures in a Flash EPROM circuit, and more particularly to maintaining high field threshold voltages with reduced field oxide thicknesses in the periphery transistor cell structures.

BACKGROUND OF THE INVENTION

In typical Flash EPROM technology, a semiconductor wafer is processed to have a central area of a desired number of Flash EPROM transistors. Usually, surrounding the Flash EPROM transistors in a border-like arrangement are a desired number of peripheral transistors. Together, the central Flash EPROM transistors and the peripheral transistors form a non-volatile memory circuit.

Presently, scaling down of Flash EPROM cells has been considered critical in continuing the trend toward higher device density. Typically, however, the scaling of cell size has not been accompanied by a scaling in the internal operation voltage requirement for the cell. Without a corresponding reduction in voltage requirements, more severe requirements are placed on the periphery transistor devices, thus limiting the amount of die size reduction possible in Flash EPROM manufacturing.

Further, with the burden placed on the periphery transistor devices to handle high field threshold voltages, the ability to reduce the size of these periphery transistors is limited. Typically, peripheral transistors have a thick field oxide layer, on the order of 4000 angstroms (Å), in order to handle these high field threshold voltages. Unfortunately, such large thicknesses in the field oxide layer contradict the desired thinness in the gate oxide layer as the device size shrinks. Thus, the ability to reduce the size of the peripheral transistors is limited by the need to maintain a thick field oxide layer in order to properly handle high field threshold voltages (e.g., on the order of $|\pm 12|$ volts (V)).

What is needed therefore is a non-volatile memory circuit structure that allows the size of peripheral transistors to be reduced without harming the ability to handle high field threshold voltages.

SUMMARY OF THE INVENTION

The present invention addresses these needs. In a first embodiment, a method for maintaining a high field threshold voltage in a plurality of transistors of reduced size in a periphery region of a Flash EPROM semiconductor circuit includes forming a first polysilicon layer as a floating poly in a predetermined number of transistors of the plurality of transistors in the periphery region, and forming a second polysilicon layer as a common gate line in the plurality of transistors, wherein the predetermined number of transistors prevent breakdown of the plurality of transistors below a predetermined field threshold voltage.

In another embodiment, a method for decreasing field oxide thickness while maintaining a high field threshold voltage in a plurality of transistors in a periphery region of a Flash EPROM semiconductor circuit includes forming a field oxide layer with a predetermined thickness for the plurality of transistors, and forming a floating poly in a predetermined number of transistors of the plurality of transistors in the periphery region, wherein the predetermined number of transistors prevent cross-talk in the periphery region by handling a high field threshold voltage in the plurality of transistors.

In one aspect, the field oxide layer has a thickness of about 2500 angstroms. In a further aspect, the method includes forming a common gate line in the plurality of transistors.

A further embodiment of the present invention includes a plurality of transistors formed in a periphery region of a Flash EPROM semiconductor circuit, the plurality of transistors including a first predetermined number of periphery transistors having a floating poly and a common gate line, and a second predetermined number of periphery transistors having the common gate line and adjacent the first predetermined number of transistors, the first predetermined number of transistors being prevented from communicating with the second predetermined number of transistors below a predetermined field threshold voltage.

With the present invention, formation of a single field oxide layer is effectively used, which reduces fabrication complexity and cost. Further, the present invention integrates the formation of a floating poly into selected periphery transistors to maintain capable handling of high field threshold voltages in the periphery region. Thus, a convenient, straightforward, and efficient mechanism for producing a high integrity non-volatile memory circuit is achieved.

These and other advantages of the aspects of the present invention will be more fully understood in conjunction with the following detailed description and accompanying drawings.

BRIEF DESCRIPTION OF THE DRAWINGS

FIG. 1b illustrates another partial cross-sectional view of the Flash EPROM cell of FIG. 1a.

DETAILED DESCRIPTION

The present invention relates to formation of non-volatile memory circuit structures that include peripheral transistors with reduced field oxide layer thicknesses and maintain the integrity at high field threshold voltages. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1A:
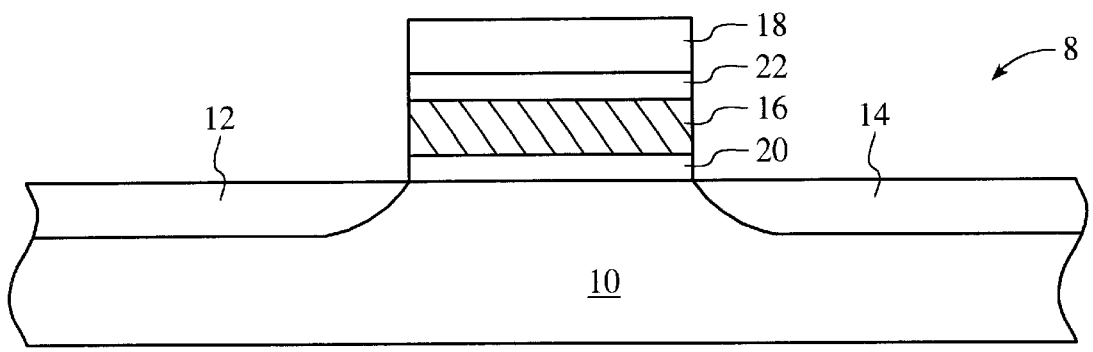
FIG. 1a illustrates a partial cross-sectional view of a prior art Flash EPROM cell.

As shown in FIG. 1a, a partial cross-sectional view of a prior art Flash EPROM cell 8 includes a substrate 10, a source region 12, a drain region 14, a floating gate 16, and a control gate line 18. Typically, the substrate 10 is doped with a p-type dopant, such as boron, while the source 12 and drain 14 regions are doped with an n-type dopant, such as phosphorous or arsenic, as is well known to those skilled in the art. A tunnel oxide region 20, typically comprising silicon dioxide or nitride oxide and having a thickness of between about 80–100 Å, is formed over the substrate 10 by well known techniques and lies between the substrate 10 and floating gate 16. Typically, floating gate 16 and control gate line 18 are polysilicon layers having thicknesses of about 500 Å and 1200 Å, respectively.

Figure 1B:
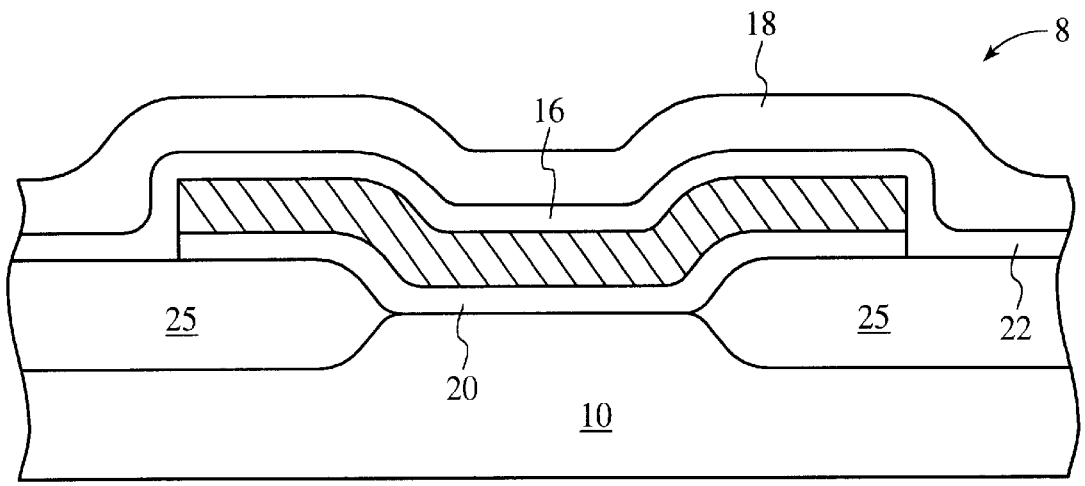

Typically, an inter-poly dielectric layer 22, i.e., a layer formed between the floating gate 16 and the control gate line 18, comprises a composite oxide-nitride-oxide layer (ONO), such as $SiO_2/Si_3N_4/SiO_2$. The inter-poly layer 22 usually overlies a polysilicon layer 16 that overlaps the tunnel oxide region 20, as shown in FIG. 1b. The inter-poly layer 22 typically is between about 150–250 Å thick, while the polysilicon layer (i.e., floating poly 16) overlaps the field oxide layer 25 about 0.25 micron ($\mu m$) beyond the source and drain regions of a 0.5 $\mu m$ cell. For most Flash EPROM cells, field oxide layer 25 has a thickness of about 2500 Å.

Figure 1C:
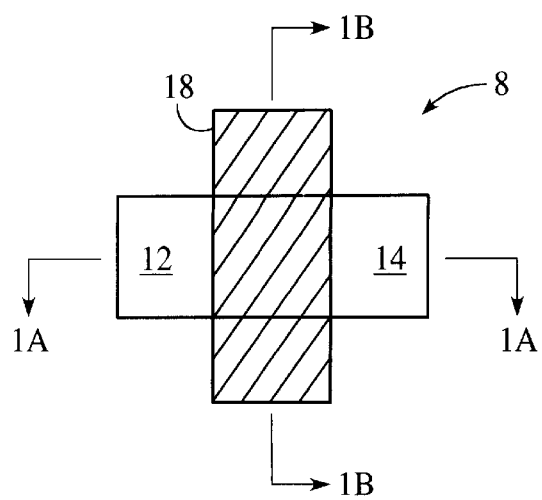
FIG. 1c illustrates a partial top-view schematic showing the directions of the cross-sectional views of Flash EPROM cell of FIGS. 1a and 1b.

FIG. 1c illustrates a partial top-view schematic showing the directions of the cross-sectional views of Flash EPROM cell 8 as illustrated in FIGS. 1a and 1b. The corresponding reference numerals as shown in FIG. 1c are described with reference to FIGS. 1a and 1b. Of course, the schematic of FIG. 1c represents only one transistor in a plurality of Flash EPROM transistors normally formed within a certain region, usually a central region, of a semiconductor die. Surrounding these Flash EPROM cells in the periphery region of the die are typically a plurality of peripheral transistors.

Figure 2:
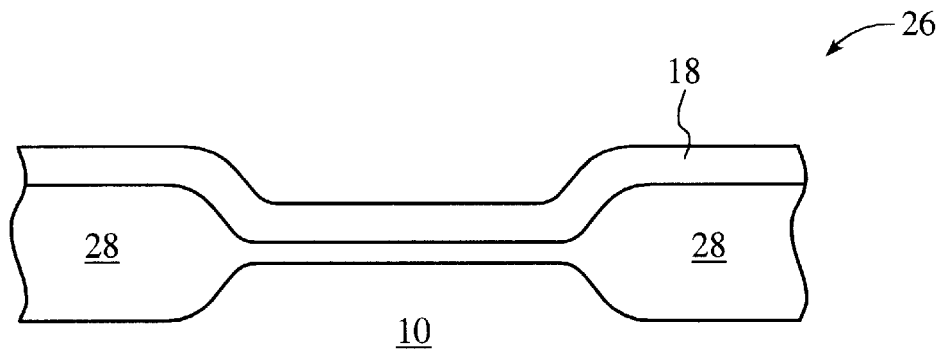
FIG. 2 presents a cross-sectional view of a prior art peripheral transistor.

FIG. 2 presents a cross-sectional view of a prior art peripheral transistor 26 with like portions of the transistor 26 to the transistor 8 labelled equivalently. In contrast to the Flash EPROM transistor 8, the peripheral transistor 26 has a field oxide layer 28 with a thickness of about 4000 Å. As mentioned above, the increased thickness of the field oxide layer 28 versus the field oxide layer 25 allows the peripheral transistor 26 to avoid breakdown below high field threshold voltages, such as $|\pm 12|$.

Figure 3:
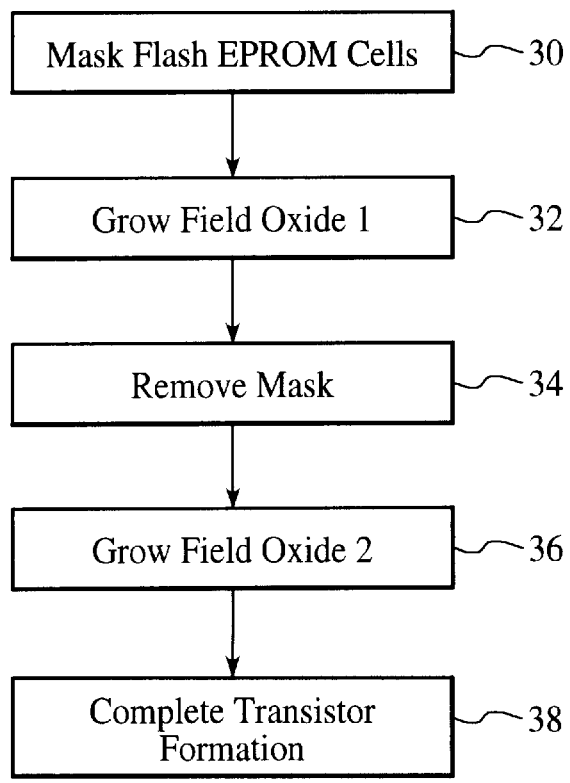
FIG. 3 presents a flow diagram associated with forming the gate oxide layers in a Flash EPROM transistor and a peripheral transistor

FIG. 3 presents a flow diagram associated with forming the field oxide layers 25 and 28 in Flash EPROM transistor 8 and peripheral transistor 26, respectively. Processing includes masking the Flash EPROM transistors via step 30. A field oxide layer is then formed by conventional LOCOS processing methods in step 32 over the peripheral transistor region to a desired thickness, such as 1500 Å. The mask is then removed via step 34. Processing continues with continued formation of a field oxide layer by conventional techniques over the entire wafer via step 36 to a thickness of about 2500 Å before transistor formation is completed via step 38, the details of which are well understood by those skilled in the art. As illustrated by this method, conventionally, those regions of the wafer masked during the first field oxide formation step, i.e., the Flash EPROM cell regions, have a field oxide layer thinner than those regions of the wafer, i.e., the peripheral transistor region, unmasked. Using typical thicknesses, the field oxide layer formed in the Flash EPROM regions is about 2500 Å, while the thickness of the field oxide layer formed in the peripheral regions is about 4000 Å.

With the prior art method of forming the field oxide layer in two steps, additional steps 30 and 34 are required to place and remove the mask over the Flash EPROM region. These additional steps complicate the Flash EPROM process and increase manufacturing costs, as well as increase the potential for circuit contamination and damage. To simply reduce the formation of the field oxide layer to a single step and produce a layer with a thickness of about 4000 Å, which would maintain proper resistance to field transistor turn-on below about $|\pm 12|$, unfortunately is not suitable for reduced-sized Flash EPROM cells. Such a thick field oxide layer, especially in those Flash EPROM cells where the active area is narrow, often results in undesirable degradation in the tunnel oxide region of these cells.

The present invention, however, effectively reduces the field oxide layer formation to a single step, while maintaining desired resistance to field turn-on below about $|\pm 12|$, as illustrated by the flow diagram of FIG. 4. A method in accordance with the present invention includes forming a field oxide layer by conventional techniques over the entire wafer via step 40. Preferably, the thickness of the field oxide layer is thin enough to avoid degradation of the tunnel oxide region of the Flash EPROM cells. By way of example, a thickness of about 2500 Å has been found to be suitable. Of course, with the thickness of the field oxide layer reduced in the peripheral transistors to about 2500 Å by the single layer formation step 40, the field turn-on voltage for these transistors is typically degraded. However, the present invention takes to advantage the process of forming a floating poly in the Flash EPROM cells in order to maintain desired field turn-on voltage levels.

Figure 4:
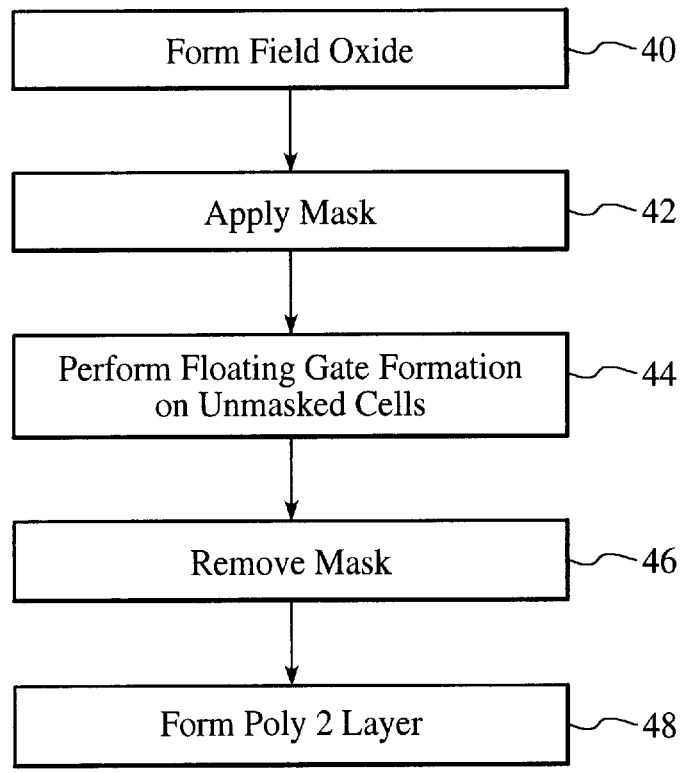
FIG. 4 illustrates a flow diagram with a single field oxide layer formation step in accordance with the present invention.

Continuing in the flow diagram of FIG. 4, once the field oxide layer has been formed, a mask is applied via step 42, so that a selected portion of the periphery and central regions of the wafer are covered with poly silicon material via step 44. The floating poly formation, including formation of the tunnel oxide, first polysilicon layer and ONO layers, (e.g., layers 20, 16, and 22 of FIGS. 1a and 1b) occurs via step 44, again by conventional techniques. Thus, a selected pattern of Flash EPROM cells include floating gates, as well as a selected number of floating poly in the periphery region of the wafer in the unmasked portions of the wafer. The mask is then removed via step 46, and the second polysilicon layer is formed in a desired pattern via step 48, again by conventional techniques.

Figure 5:
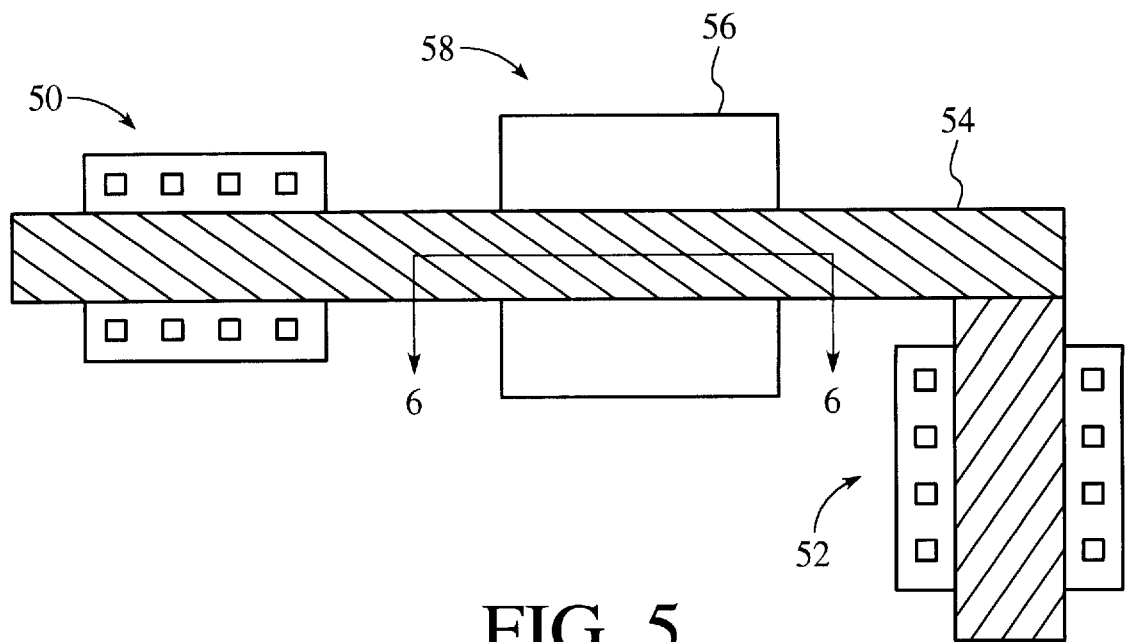
FIG. 5 illustrates schematically a portion of the peripheral region including a channel stop in accordance with the present invention.

Having selected locations in the peripheral region formed with a floating poly in accordance with the present invention provides a channel stop in those portions of the circuit having high voltage signal operations. FIG. 5 illustrates schematically a portion of the peripheral region including the channel stop in accordance with the present invention. In order to ensure that the source or drain region of peripheral transistor 50 does not conduct current with the source or drain region of peripheral transistor 52 by voltage application to common gate line 54 formed by the second polysilicon layer, i.e., that no cross-talk occurs a channel stop is preferably used via selective formation of the first polysilicon layer 56 in the periphery region in a transistor 58. Depending upon the area of the first polysilicon layer 56 and the area of overlap of the first polysilicon layer 56 with the second polysilicon layer 54, as well as the thickness ratio between the ONO and field oxide layer, a low enough coupling ratio ($\alpha_g$), i.e., the ratio of voltage on the second polysilicon layer to the voltage on the first polysilicon layer, as is well understood to those skilled in the art, is obtained in the peripheral region to handle a high field threshold voltage.

Figure 6:
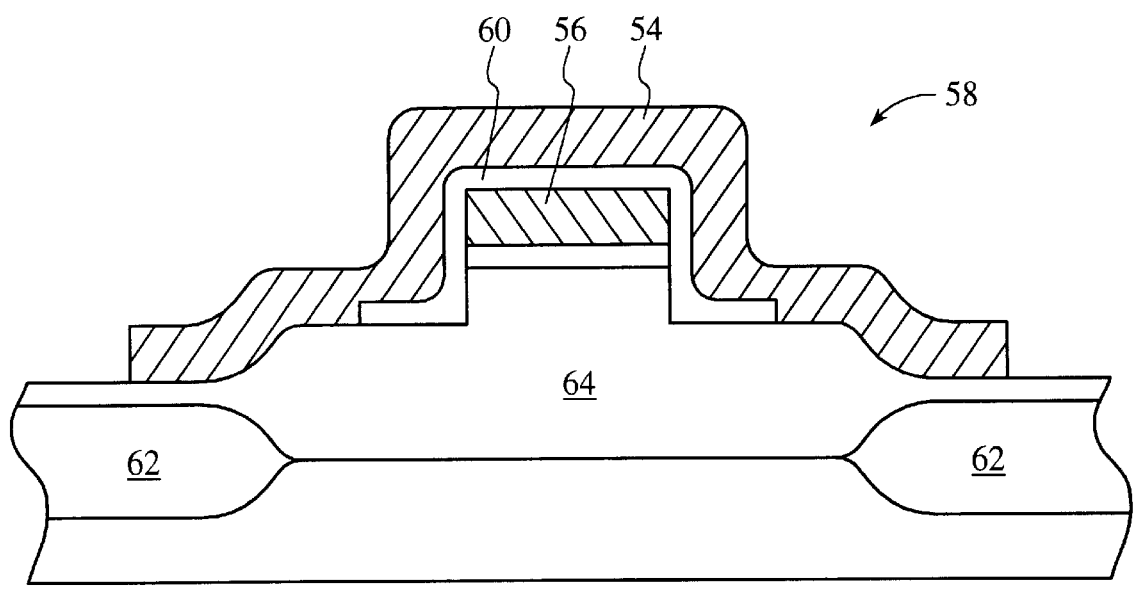
FIG. 6 illustrates a cross-sectional view of transistor 58 of FIG. 5.

FIG. 6 illustrates a cross-sectional view of transistor 58. As shown, transistor 58 includes first polysilicon layer 56, second polysilicon layer 54, ONO layer 60, and source/drain regions 62. As shown by the following equation, when the coupling ratio ($\alpha_g$) is less than about 0.75 and the field threshold voltage of the first polysilicon layer 56 is about $|\pm 9|$, a field threshold voltage for the second polysilicon layer 54 of about $|\pm 12|$ is achieved.

$\alpha_g = A_2/T_{ono}/A_1/T_{fox} + (A_2/T_{ono})$, where $A_1$ is the area of the first polysilicon layer 56, $A_2$ is the overlap area between the first polysilicon layer 56 and the second polysilicon layer 54, $T_{ono}$ is the thickness of the ONO layer 60, and $T_{fox}$ is the thickness of the field oxide layer 64.

Thus, in the present invention, a single field oxide layer is capably utilized in conjunction with selective formation of the first polysilicon layer 56 in the periphery region to satisfy field threshold voltage requirements.

Although the present invention has been described in accordance with the embodiments shown, one of ordinary skill in the art will recognize that there could be variations to the embodiment and those variations would be within the spirit and scope of the present invention. For example, the thicknesses of the various layers and the field threshold voltage requirements are based on currently known conventional values. However, the present invention may be suitably applied in other fabrication methods using different values. Accordingly, many modifications may be made by one of ordinary skill without departing from the spirit and scope of the present invention, the scope of which is defined solely by the following claims.

What is claimed is:

1. A method for decreasing field oxide thickness while maintaining a high field threshold voltage in a second predetermined number of transistors of a plurality of transistors in a periphery region of a Flash EPROM semiconductor circuit, the method comprising:

forming a field oxide layer with a predetermined thickness for each of a first predetermined number of transistors of the plurality of transistors in the periphery region; and forming a floating polysilicon layer in each of the first predetermined number of transistors of the plurality of transistors in the periphery region, wherein the first predetermined number of transistors prevent cross-talk among transistors in the second predetermined number of transistors of the plurality of transistors in the periphery region by a high field threshold voltage.

2. The method of claim 1 wherein the field oxide layer has a thickness of about 2500 angstroms.

3. The method of claim 1 further comprising forming a common gate line in the plurality of transistors.

4. The method of claim 3 further comprising forming an oxide-nitride-oxide layer between the floating polysilicon layer and the common gate line in each of the first predetermined number of transistors of the plurality of transistors.

5. The method of claim 1 wherein the high field threshold voltage is a voltage of about $|\pm 12|$ Volts.

6. A method for maintaining a high field threshold voltage in a second predetermined number of transistors of a plurality of transistors of reduced size in a periphery region of a Flash EPROM semiconductor circuit, the method comprising:

(a) forming a first polysilicon layer as a floating polysilicon layer in each of a first predetermined number of transistors of the plurality of transistors in the periphery region; and (b) forming a second polysilicon layer as a common gate line in each of the first predetermined number of transistors of the plurality of transistors, wherein the first predetermined number of transistors prevent breakdown of the second predetermined number of transistors of the plurality of transistors below a predetermined field threshold voltage.

7. The method of claim 1 wherein the first polysilicon layer has a thickness of about 500 angstroms.

8. The method of claim 1 wherein the predetermined field threshold voltage is about $|\pm 12|$ Volts.

9. The method of claim 1 wherein the method further comprises:

(c) forming an ONO (oxide-nitride-oxide) layer between the first polysilicon layer and the second polysilicon layer in each of the first predetermined number of transistors.

10. The method of claim 9 wherein the oxide-nitride-oxide layer has a thickness of about 150 angstroms.

11. The method of claim 1 wherein the second polysilicon layer has a thickness of about 1200 angstroms.

12. A plurality of transistors formed in a substrate of a periphery region of a Flash EPROM semiconductor circuit, the plurality of transistors comprising:

a first predetermined number of periphery transistors each having a floating polysilicon layer and a common gate line; and a second predetermined number of periphery transistors having the common gate line and adjacent the first predetermined number of transistors, the first predetermined number of periphery transistors preventing communication among the second predetermined number of periphery transistors below a predetermined field threshold voltage.

13. The plurality of transistors of claim 12 wherein each of the first predetermined number of transistors have an oxide-nitride-oxide layer between the floating polysilicon layer and the common gate line.

14. The plurality of transistors of claim 12 wherein the first predetermined number of transistors each have a field oxide layer with a thickness of about 2500 angstroms.

15. The plurality of transistors of claim 12 wherein the predetermined field threshold voltage is about $|\pm 12|$ Volts.

* * * * *